(12) United States Patent
Houck et al.

(10) Patent No.: US 7,656,256 B2
(45) Date of Patent: Feb. 2, 2010

(54) THREE-DIMENSIONAL MICROSTRUCTURES HAVING AN EMBEDDED SUPPORT MEMBER WITH AN APERTURE THEREIN AND METHOD OF FORMATION THEREOF

(75) Inventors: William D. Houck, Blacksburg, VA (US); David W. Sherrer, Radford, VA (US)

(73) Assignee: Nuvotronics, PLLC, Radford, VA (US)

( * ) Notice: Subject to any disclaimer, the term of this patent is extended or adjusted under 35 U.S.C. 154(b) by 30 days.

(21) Appl. No.: 12/005,936

(22) Filed: Dec. 28, 2007

(65) Prior Publication Data
US 2008/0197946 A1  Aug. 21, 2008

Related U.S. Application Data

(60) Provisional application No. 60/878,278, filed on Dec. 30, 2006.

(51) Int. Cl.
*H01P 3/06* (2006.01)
(52) U.S. Cl. .......................................... 333/244; 29/828
(58) Field of Classification Search ................ 333/243, 333/244, 238; 29/828; 174/28
See application file for complete search history.

(56) References Cited

U.S. PATENT DOCUMENTS

| 2,997,519 | A |   | 8/1961  | Hines et at            |
|-----------|---|---|---------|------------------------|
| 3,560,896 | A | * | 2/1971  | Essinger ........ 333/243 |
| 4,365,222 | A |   | 12/1982 | Lampert et al.         |
| 4,414,424 | A | * | 11/1983 | Mizoguchi et al. ...... 174/28 |
| 4,437,074 | A | * | 3/1984  | Cohen et al. ....... 333/128 |
| 4,673,904 | A |   | 6/1987  | Landis                 |
| 5,381,157 | A |   | 1/1995  | Shiga                  |
| 5,406,235 | A |   | 4/1995  | Hayashi et al.         |
| 5,712,607 | A | * | 1/1998  | Dittmer et al. ....... 333/238 |
| 5,793,272 | A |   | 8/1998  | Burghartz et al.       |
| 6,008,102 | A |   | 12/1999 | Alford et al.          |
| 6,466,112 | B1|   | 10/2002 | Kwon et al.            |
| 6,535,088 | B1| * | 3/2003  | Sherman et al. ....... 333/238 |
| 7,012,489 | B2|   | 3/2006  | Sherrer et al.         |
| 7,148,772 | B2|   | 12/2006 | Sherrer et al.         |
| 2003/0222738 | A1 |   | 12/2003 | Brown et al.        |

FOREIGN PATENT DOCUMENTS

| EP | 0 845 831    | 6/1998  |
| EP | 0 911 903    | 4/1999  |
| JP | 6085510      | 3/1994  |
| WO | WO 00/07218  | 2/2000  |
| WO | WO 00/39854  | 7/2000  |

(Continued)

OTHER PUBLICATIONS

Elliott Brown/MEMGen Corporation, "RF Applications of EFAB Technology", MTT-S IMS 2003, pp. 1-15.

(Continued)

*Primary Examiner*—Benny Lee
(74) *Attorney, Agent, or Firm*—Sherr & Vaughn, PLLC

(57) ABSTRACT

Provided are three-dimensional microstructures and their methods of formation. The microstructures are formed by a sequential build process and include microstructural elements which are affixed to one another. The microstructures find use, for example, in coaxial transmission lines for electromagnetic energy.

17 Claims, 9 Drawing Sheets

FOREIGN PATENT DOCUMENTS

WO  WO 02/080279  10/2002

OTHER PUBLICATIONS

Yoon et al., "3-D Lithography and Metal Surface Micromachining for RF and Microwave MEMs" IEEE MEMS 2002 Conference, Las Vegas, NV, Jan. 2002, pp. 673-676.

Brown et al, "A Low-Loss Ka-Band Filter in Rectangular Coax Made by Electrochemical Fabrication", submitted to Microwave and Wireless Components Letters, date unknown (downloaded from www.memgen.com, 2004).

Chomnawang et al., "On-chip 3D Air Core Micro-Inductor for High-Frequency Applications Using Deformation of Sacrificial Polymer", Proc. SPIE, vol. 4334, pp. 54-62, Mar. 2001.

Park et al., "Electroplated Micro-Inductors and Micro-Transformers for Wireless applications",IMAPS 2002, Denver, CO, Sep. 2002.

Katehi et al., "MEMS and Si Micromachined Circuits for High-Frequency Applications", IEEE Transactions on Microwave Theory and Techniques, vol. 50, No. 3, Mar. 2002, pp. 858-866.

Yoon et al., "Monolithic Integration of 3-D Electroplated Microstructures with Unlimited Number of Levels Using Planarization with a Sacrificial Metallic Mole (PSMm)", Twelfth IEEE Int'l Conf. on Micro Electro mechanical systems, Orlando Florida, Jan. 1999, pp. 624-629.

Yoon et al., "CMOS-Compatible Surface Micromachined Suspended-Spiral Inductors for Multi-GHz Silicon RF ICs", IEEE Electron Device Letters, vol. 23. No. 10, Oct. 2002, pp. 591-593.

Yoon et al., "Multilevel Microstructure Fabrication Using Single-Step 3D Photolithography and Single-step Electroplating", Proc. of SPIE, vol. 3512, (Sep. 1998), pp. 358-366.

Lee et al., "Micromachining Applications of a High Resolution Ultrathick Photoresist", J. Vac. Sci. Technol. B 13 (6), Nov./Dec. 1995, pp. 3012-3016.

H. Guckel, "High-Aspect-Ratio Micromachining Via Deep X-Ray Lithography", Proc. of IEEE, vol. 86, No. 8 (Aug. 1998), pp. 1586-1593.

Yoon et al., "Monolithic High-Q Overhang Inductors Fabricated on Silicon and Glass Substrates", International Electron Devices Meeting, Washington D.C. (Dec. 1999), pp. 753-756.

Engelmann et al., "Fabrication of High Depth-to-Width Aspect Ratio Microstructures", IEEE Micro Electro Mechanical Systems (Feb. 1992), pp. 93-98.

Frazier et al., "Metallic Microstructures Fabricated Using Photosensitive Polyimide Electroplating Molds ", Journal of Microelectromechanical Systems, vol. 2, No. 2, Jun. 1993, pp. 87-94.

Yoon et al., "High-Performance Three-Dimensional On-Chip Inductors Fabricated by Novel Micromachining Technology for RF MMIC", 1999 IEEE MTT-S Int'l Microwave Symposium Digest, vol. 4, Jun. 13-19, 1999, Anaheim, California, pp. 1523-1526.

Loechel et al., "Application of Ultraviolet Depth Lithography for Surface Micromachining", J. Vac. Sci. Technol. B 13 (6), Nov./Dec. 1995, pp. 2934-2939.

Yoon et al., "High-Performance Electroplated Solenoid-Type Integrated Inductor ($SI^2$) for RF Applications Using Simple 3D Surface Micromachining Technology", Int'l Election Devices Meeting, 1998, San Francisco, CA, Dec. 6-9, 1998, pp. 544-547.

\* cited by examiner

SECTION AA

SECTION AA

SECTION AA

SECTION AA

THREE-DIMENSIONAL MICROSTRUCTURES HAVING AN EMBEDDED SUPPORT MEMBER WITH AN APERTURE THEREIN AND METHOD OF FORMATION THEREOF

This application claims the benefit of priority under 35 U.S.C. §119(e) of Provisional Application No. 60/878,278, filed Dec. 30, 2006, the entire contents of which are herein incorporated by reference.

GOVERNMENT INTEREST

This invention was made with U.S. Government support under Agreement No. W911QX-04-C-0097 awarded by DARPA. The Government has certain rights in the invention.

BACKGROUND

This invention relates generally to microfabrication technology and to the formation of three-dimensional microstructures. The invention has particular applicability to microstructures for transmitting electromagnetic energy, such as coaxial transmission element microstructures, and to methods of forming such microstructures by a sequential build process.

The formation of three-dimensional microstructures by sequential build processes have been described, for example, in U.S. Pat. No. 7,012,489, to Sherrer et al. With reference to FIG. 1, the '489 patent discloses a coaxial transmission line microstructure 2 formed by a sequential build process. The microstructure is formed on a substrate 4, and includes an outer conductor 6, a center conductor 8 and one or more dielectric support members 10 which support the center conductor. The outer conductor includes a conductive base layer 12 forming a lower wall, conductive layers 14, 16 and 18 forming sidewalls, and conductive layer 20 forming an upper wall of the outer conductor. The volume 22 between the inner and outer conductors is air or vacuous, formed by removal of a sacrificial material from the structure which previously filled such volume.

When fabricating microstructures of different materials, for example, suspended microstructures such as the center conductor in the microstructure of the '489 patent, problems can arise due to insufficient adhesion between structural elements, particularly when the elements are formed of different materials. For example, materials useful in forming the dielectric support members may exhibit poor adhesion to the metal materials of the outer conductor and center conductor. As a result of this poor adhesion, the dielectric support members can become detached from either or both of the outer and center conductors, this notwithstanding the dielectric support member being embedded at one end in the outer conductor sidewall. Such detachment can prove particularly problematic when the device is subjected to vibration or other forces in manufacture and post-manufacture during normal operation of the device. The device may, for example, be subjected to extreme forces if used in a high-velocity vehicle such as an aircraft. As a result of such detachment, the transmission performance of the coaxial structure may become degraded and the device may be rendered inoperable.

There is thus a need in the art for improved three-dimensional microstructures and for their methods of formation which would address problems associated with the state of the art.

SUMMARY

In accordance with a first aspect of the invention, provided are three-dimensional microstructures formed by a sequential build process. The microstructures include: a first microstructural element constructed of a dielectric material and having an aperture extending at least partially therethrough; a second microstructural element constructed of a metal material; a metal material in the aperture affixing the first microstructural element to the second microstructural element; and a non-solid volume to which the first microstructural element and/or the second microstructural element are exposed. The microstructure may include a substrate over which the first and second microstructural elements are disposed. In one embodiment of the invention, the microstructure may include a coaxial transmission line having a center conductor, an outer conductor and a dielectric support member for supporting the center conductor, the dielectric support member being the first microstructural element, and the inner conductor and/or the outer conductor being the second microstructural element.

In accordance with a second aspect of the invention, provided are methods of forming three-dimensional microstructures by a sequential build process. The methods involve disposing a plurality of layers over a substrate. The layers include a layer of a dielectric material, a layer of a metal material and a layer of a sacrificial material. A first microstructural element constructed of the dielectric material and having an aperture extending at least partially therethrough is formed. A second microstructural element constructed of the metal material is formed. A metal material is deposited in the aperture, affixing the first microstructural element to the second microstructural element. The sacrificial material is removed to form a non-solid volume to which the first microstructural element and/or the second microstructural element are exposed.

Reference is now made to embodiments of the present invention, in which like numerals indicate like elements throughout the drawing figures. Other features and advantages of the present invention will become apparent to one skilled in the art upon review of the following description, claims, and drawings appended hereto.

The present invention will be discussed with reference to the following drawings, in which like reference numerals denote like features, and in which:

DETAIL DESCRIPTION

The exemplary processes to be described involve a sequential build to create three-dimensional microstructures. The term "microstructure" refers to structures formed by microfabrication processes, typically on a wafer or grid-level. In the sequential build processes of the invention, a microstructure is formed by sequentially layering and processing various materials and in a predetermined manner. When implemented, for example, with film formation, lithographic patterning, etching and other optional processes such as planarization techniques, a flexible method to form a variety of three-dimensional microstructures is provided.

The sequential build process is generally accomplished through processes including various combinations of: (a) metal, sacrificial material (e.g., photoresist) and dielectric coating processes; (b) surface planarization; (c) photolithography; and (d) etching or other layer removal processes. In depositing metal, plating techniques are particularly useful, although other metal deposition techniques such as physical vapor deposition (PVD) and chemical vapor deposition (CVD) techniques may be used.

The exemplary embodiments of the invention are described herein in the context of the manufacture of a coaxial transmission line for electromagnetic energy. Such a structure finds application, for example, in the telecommunications industry in radar systems and in microwave and millimeter-wave devices. It should be clear, however, that the technology described for creating microstructures is in no way limited to the exemplary structures or applications but may be used in numerous fields for microdevices such as in pressure sensors, rollover sensors; mass spectrometers, filters, microfluidic devices, surgical instruments, blood pressure sensors, air flow sensors, hearing aid sensors, image stabilizers, altitude sensors, and autofocus sensors. The invention can be used as a general method to mechanically lock together heterogeneous materials that are microfabricated together to form new components. The exemplified coaxial transmission line microstructures are useful for propagation of electromagnetic energy having a frequency, for example, of from several MHz to 100 GHz or more, including millimeter waves and microwaves. The described transmission lines find further use in the transmission of direct current (dc) signals and currents, for example, in providing a bias to integrated or attached semiconductor devices.

Figure 1:
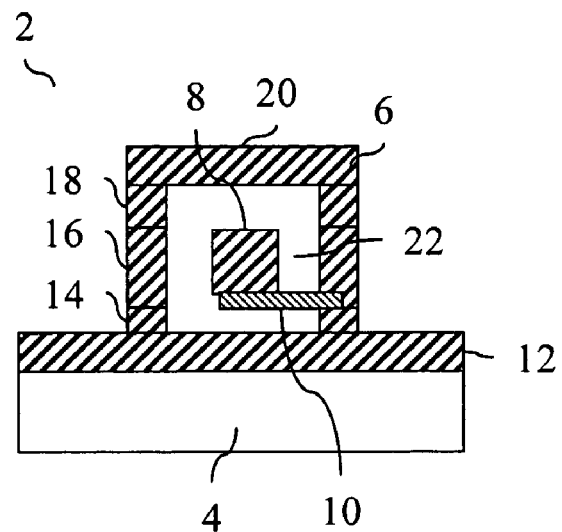
FIG. 1 illustrates a cross-sectional view of a known coaxial transmission line microstructure.
Figure 2:
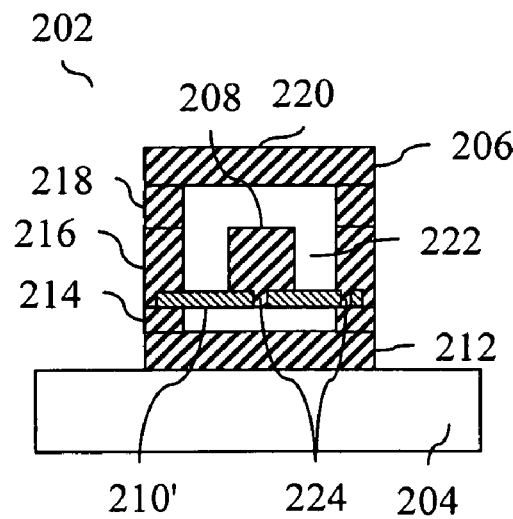
FIG. 2 illustrates a cross-sectional view of an exemplary three-dimensional microstructure in accordance with the invention.

FIG. 2 illustrates exemplary features of a three-dimensional transmission line microstructure 202 formed by a sequential build process in accordance with the invention. The microstructure includes a substrate 204, an outer conductor 206, a center conductor 208 and one or more dielectric support members 210' for supporting the center conductor. The outer conductor includes a conductive base layer 212 forming a lower wall, conductive layers 214, 216 and 218 forming sidewalls, and conductive layer 220 forming an upper wall of the outer conductor. The conductive base layer 212 and conductive layer 220 may optionally be provided as part of a conductive substrate or a conductive layer on a substrate. The volume 222 between the center conductor and the outer conductor is a non-solid, for example, a gas such as air or sulphur hexaflouride, vacuous or a liquid. The dielectric support member has one or more apertures 224 in the vicinity of the center conductor and/or outer conductor. The apertures as illustrated extend through the dielectric support member from the member's top surface to bottom surface, but may extend partially therethrough. A metal material is disposed in the apertures thereby affixing the dielectric support members to the center and outer conductors.

Figure 3:
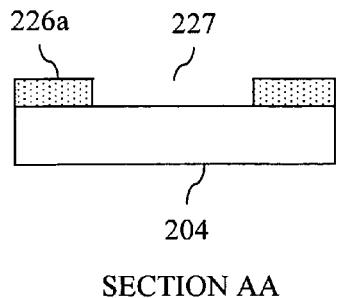
FIGS. 3-15 illustrate side- and top-sectional views of the three-dimensional microstructure of FIG. 2 at various stages of formation in accordance with the invention.
Figure 3:
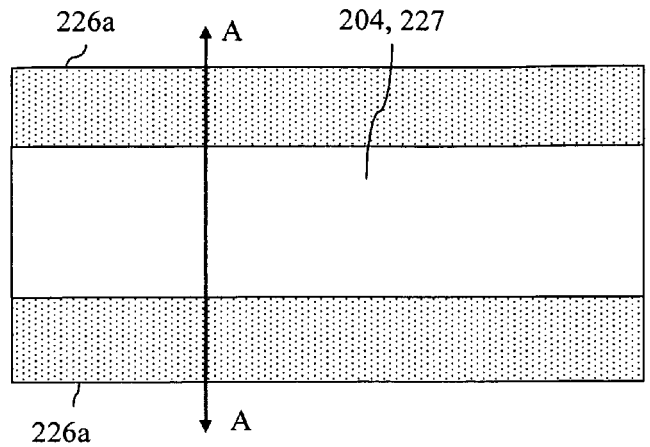

Exemplary methods of forming the coaxial transmission line microstructure of FIG. 2 will now be described with reference to FIGS. 3-15. The transmission line is formed on a substrate 204 as shown in FIG. 3, which may take various forms. The substrate may, for example, be constructed of a ceramic, a dielectric, a semiconductor such as silicon or gallium arsenide, a metal such as copper or steel, a polymer or a combination thereof. The substrate can take the form, for example, of an electronic substrate such as a printed wiring board or a semiconductor substrate, such as a silicon, silicon germanium, or gallium arsenide wafer. The substrate may be selected to have an expansion coefficient similar to the materials used in forming the transmission line, and should be selected so as to maintain its integrity during formation of the transmission line. The surface of the substrate on which the transmission line is to be formed is typically planar. The substrate surface may, for example, be ground, lapped and/or polished to achieve a high degree of planarity. Planarization of the surface of the structure being formed can be performed before or after formation of any of the layers during the process. Conventional planarization techniques, for example, chemical-mechanical-polishing (CMP), lapping, or a combination of these methods are typically used. Other known planarization techniques, for example, mechanical finishing such as mechanical machining, diamond turning, plasma etching, laser ablation, and the like, may additionally or alternatively be used.

A first layer 226a of a sacrificial photosensitive material, for example, a photoresist, is deposited over the substrate 204, and is exposed and developed to form a pattern 227 for subsequent deposition of the bottom wall of the transmission line outer conductor. The pattern includes a channel in the sacrificial material, exposing the top surface of the substrate 204. Conventional photolithography steps and materials can be used for this purpose. The sacrificial photosensitive material can be, for example, a negative photoresist such as Shipley BPRT™ 100 or PHOTOPOSIT™ SN, commercially available from Rohm and Haas Electronic Materials LLC, those described in U.S. Pat. No. 6,054,252, to Lundy et al, or a dry film, such as the LAMINAR™ dry films, also available from Rohm and Haas. The thickness of the sacrificial photosensitive material layers in this and other steps will depend on the dimensions of the structures being fabricated, but are typically from 10 to 200 microns.

Figure 4:
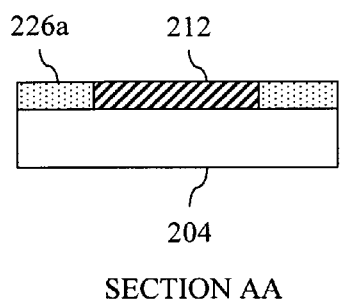
Figure 4:
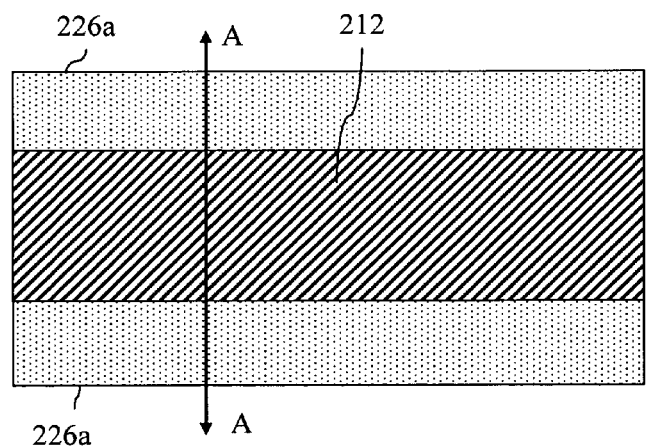

As shown in FIG. 4, a conductive base layer 212 is formed over the substrate 204 and forms a bottom wall of the outer conductor in the final structure. The base layer may be formed of a material having high conductivity, such as a metal or metal-alloy (collectively referred to as "metal"), for example copper, silver, nickel, aluminum, chromium, gold, titanium, alloys thereof, a doped semiconductor material, or combinations thereof, for example, multiple layers of such materials. The base layer may be deposited by a conventional process, for example, by plating such as electrolytic or electroless, or immersion plating, physical vapor deposition (PVD) such as sputtering or evaporation, or chemical vapor deposition (CVD). Plated copper may, for example, be particularly suitable as the base layer material, with such techniques being well understood in the art. The plating can be, for example, an electroless process using a copper salt and a reducing agent. Suitable materials are commercially available and include, for example, CIRCUPOSIT™ electroless copper, available from Rohm and Haas Electronic Materials LLC, Marlborough, Mass. Alternatively, the material can be plated by coating an electrically conductive seed layer, followed by electrolytic plating. The seed layer may be deposited by PVD over the substrate prior to coating of the sacrificial material 226a. Suitable electrolytic materials are commercially available and include, for example, COPPER GLEAM™ acid plating products, available from Rohm and Haas Electronic Materials. The use of an activated catalyst followed by electroless and/or electrolytic deposition may be used. The base layer (and subsequent layers) may be patterned into arbitrary geometries to realize a desired device structure through the methods outlined.

The thickness of the base layer (and the subsequently formed other walls of the outer conductor) is selected to provide mechanical stability to the microstructure and to provide sufficient conductivity for the electrons moving through the transmission line. At microwave frequencies and beyond, structural and thermal conductivity influences become more pronounced, as the skin depth will typically be less than 1 µm. The thickness thus will depend, for example, on the specific base layer material, the particular frequency to be propagated and the intended application. For example, in instances in which the final structure is to be removed from the substrate, it may be beneficial to employ a relatively thick base layer, for example, from about 20 to 150 µm or from 20 to 80 µm, for structural integrity. Where the final structure is to remain intact with the substrate, it may be desired to employ a relatively thin base layer which may be determined by the skin depth requirements of the frequencies used.

Appropriate materials and techniques for forming the sidewalls are the same as those mentioned above with respect to the base layer. The sidewalls are typically formed of the same material used in forming the base layer 212, although different materials may be employed. In the case of a plating process, the application of a seed layer or plating base may be omitted as here when metal in a subsequent step will only be applied directly over a previously formed, exposed metal region. It should be clear, however, that the exemplified structures shown in the figures typically make up only a small area of a particular device, and metallization of these and other structures may be started on any layer in the process sequence, in which case seed layers are typically used.

Surface planarization at this stage and/or in subsequent stages can be performed in order to remove any unwanted metal deposited on the top surface of the sacrificial material in addition to providing a flat surface for subsequent processing. Through surface planarization, the total thickness of a given layer can be controlled more tightly than might otherwise be achieved through coating alone. For example, a CMP process can be used to planarize the metal and the sacrificial material to the same level. This may be followed, for example, by a lapping process, which slowly removes metal, sacrificial material, and any dielectric at the same rate, allowing for greater control of the final thickness of the layer.

Figure 5:
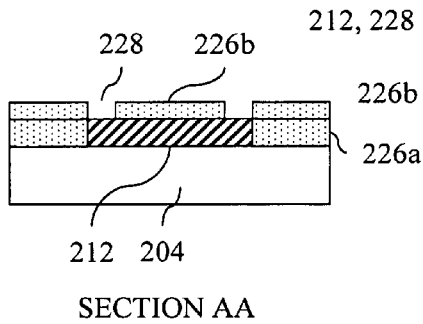
Figure 5:
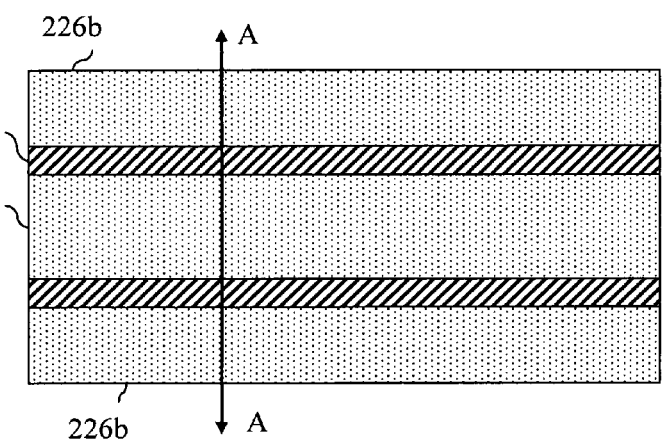

With reference to FIG. 5, a second layer 226b of the sacrificial photosensitive material is deposited over the base layer 212 and first sacrificial layer 226a, and is exposed and developed to form a pattern 228 for subsequent deposition of lower sidewall portions of the transmission line outer conductor. The pattern 228 includes two parallel channels in the sacrificial material, exposing the top surface of the base layer.

Figure 6:
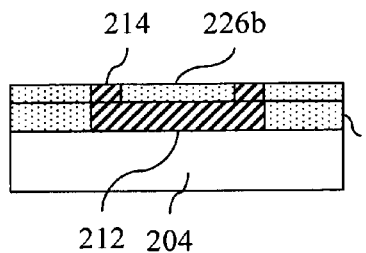
Figure 6:
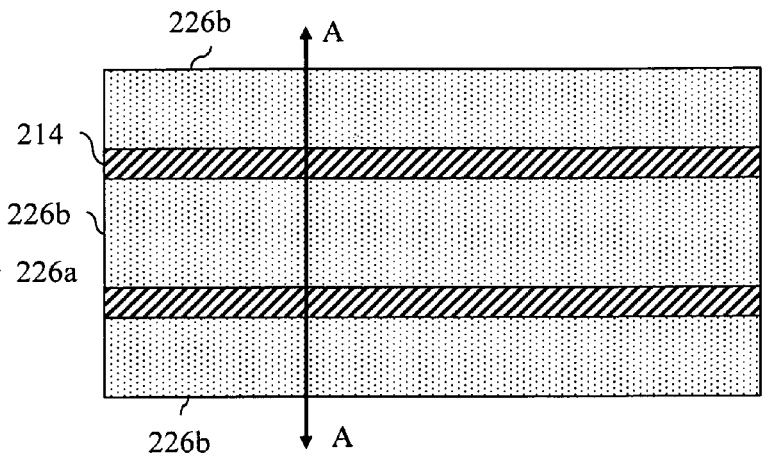

As shown in FIG. 6, lower sidewall portions 214 of the transmission line outer conductor are next formed. Appropriate materials and techniques for forming the sidewalls are the same as those mentioned above with respect to the base layer 212 although different materials may be employed. In the case of a plating process, the application of a seed layer or plating base may be omitted as here when metal in a subsequent step will only be applied directly over a previously formed, exposed metal region. Surface planarization as described above may be conducted at this stage.

Figure 7:
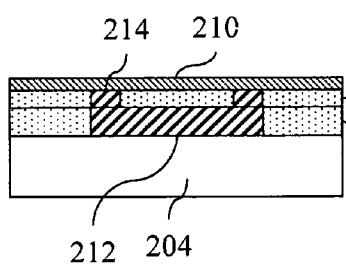
Figure 7:
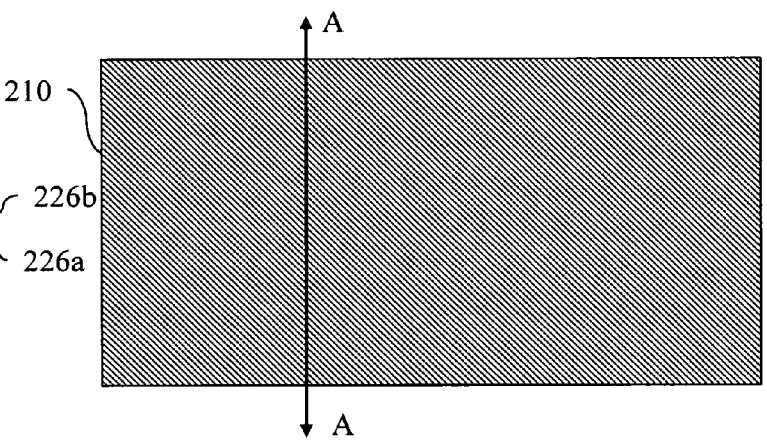

A layer 210 of a dielectric material is next deposited over the second sacrificial layer 226b and the lower sidewall portions 214, as shown in FIG. 7. In subsequent processing, support structures are patterned from the dielectric layer to support the transmission line's center conductor to be formed. As these support structures will lie in the core region of the final transmission line structure, the support layer should be formed from a material which will not create excessive losses for the signals to be transmitted through the transmission line. The material should also be capable of providing the mechanical strength necessary to support the center conductor and should be relatively insoluble in the solvent used to remove the sacrificial material from the final transmission line structure. The material is typically a dielectric material selected from photosensitive-benzocyclobutene (Photo-BCB) resins such as those sold under the tradename Cyclotene (Dow Chemical Co.), SU-8 resist (MicroChem Corp.), inorganic materials, such as silicas and silicon oxides, SOL gels, various glasses, silicon nitride ($Si_3N_4$), aluminum oxides such as alumina ($Al_2O_3$), aluminum nitride (AlN), and magnesium oxide (MgO); organic materials such as polyethylene, polyester, polycarbonate, cellulose acetate, polypropylene, polyvinyl chloride, polyvinylidene chloride, polystyrene, polyamide, and polyimide; organic-inorganic hybrid materials such as organic silsesquioxane materials; a photodefinable dielectric such as a negative acting photoresist or photoepoxy which is not attacked by the sacrificial material removal process to be conducted. Of these, SU-8 2015 resist is typical. It is advantageous to use materials which can be easily deposited, for example, by spin-coating, roller coating, squeegee coating, spray coating, chemical vapor deposition (CVD) or lamination. The support layer 210 is deposited to a thickness that provides for the requisite support of the center conductor without cracking or breakage. In addition, the thickness should not severely impact subsequent application of sacrificial material layers from the standpoint of planarity. While the thickness of the dielectric support layer will depend on the dimensions and materials of the other elements of the microstructure, the thickness is typically from 1 to 100 microns, for example, about 20 microns.

Figure 8:
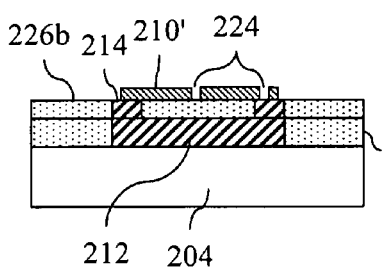
Figure 8:
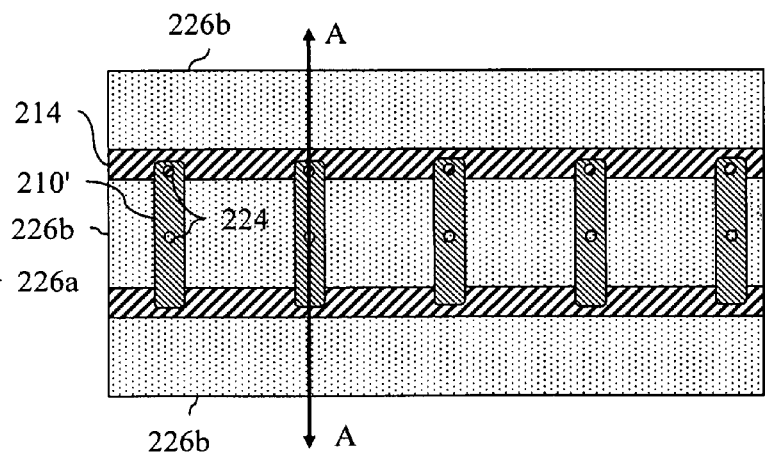

Referring to FIG. 8, the dielectric material layer 210 described with reference to FIG. 7 is next patterned using standard photolithography and etching techniques to provide one or more dielectric support members 210' for supporting the center conductor to be formed. In the illustrated device, the dielectric support members extend from a first side of the outer conductor to an opposite side of the center conductor. In another exemplary aspect, the dielectric support members may extend from the outer conductor and terminate at the center conductor. In this case, one end of each of the support members is formed over one or the other lower sidewall portion 214 and the opposite end extends to a position over the sacrificial layer 226b between the lower sidewall portions. The support members 210' are spaced apart from one another, typically at a fixed distance. The number, shape, and pattern of arrangement of the dielectric support members should be sufficient to provide support to the center conductor and its terminations while also preventing excessive signal loss and dispersion. In addition, the shape and periodicity or aperiodicity may be selected to prevent reflections at frequencies where low loss propagation is desired, as can be calculated using methods know in the art of creating Bragg gratings and filters, unless such function is desired. In the latter case, careful design of such periodic structures can provide filtering functions.

During patterning of the dielectric support members 210', one or more apertures 224 are formed therein. The apertures typically extend through the dielectric support members, as illustrated, from a top surface to a bottom surface thereof. The apertures serve the purpose of providing a volume for receipt of a metal material which is adherent to and may be considered part of the center conductor and/or outer conductor. Contact area between the dielectric members and the center and/or outer conductors through the metal material filling the apertures is thereby increased as compared with the case in which no aperture is present. As a result, the dielectric support members can be more effectively locked in place with respect to the center and/or outer conductors. In the illustrated embodiment, apertures are shown in the dielectric support member at the center and at one end. Other configurations may be used. For example, it may be beneficial to include an aperture at each end of the support member.

Figure 16A:
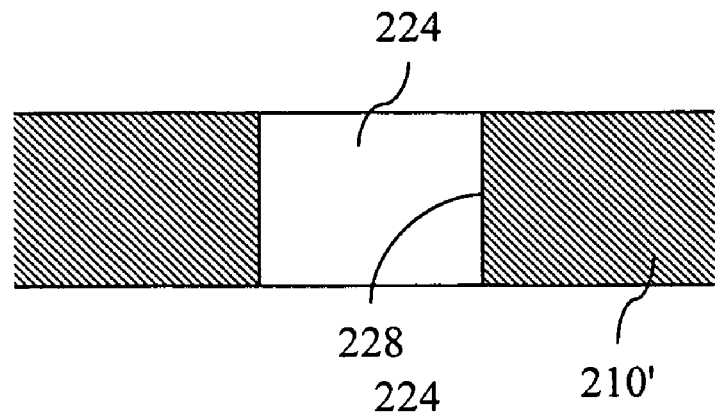
FIG. 16A-16D illustrates side-sectional views of exemplary three-dimensional microstructural dielectric elements and apertures in accordance with the invention.
Figure 16B:
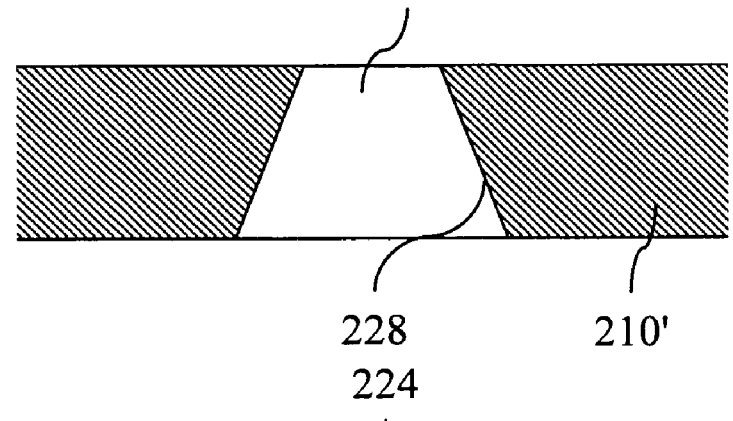
Figure 16C:
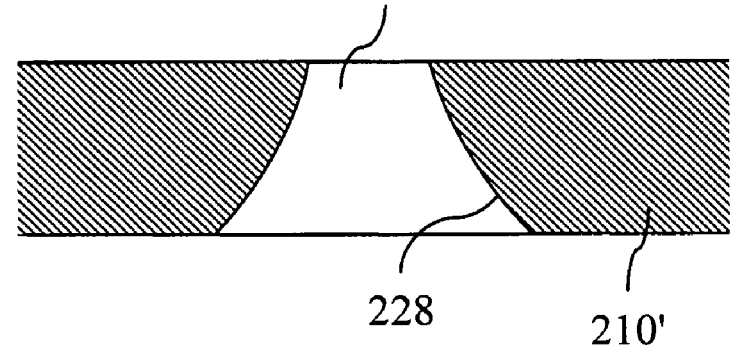
Figure 16D:
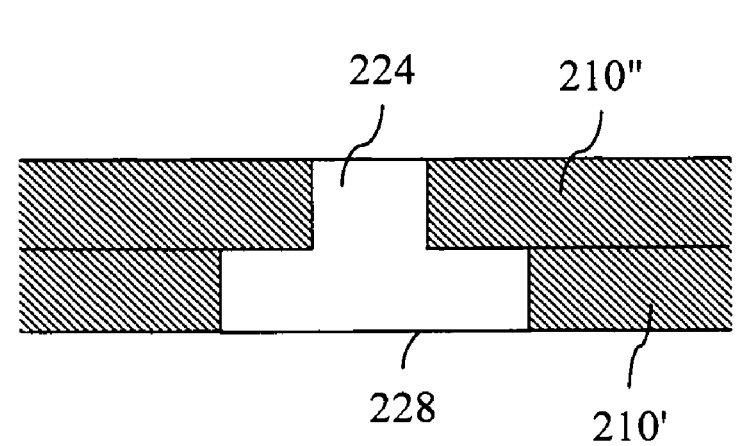

The apertures as illustrated are cylindrical in geometry. Other geometries may, of course, be used, for example, those having square, rectangular, triangular and ovular cross-sections. The aperture sidewalls may be vertical or non-vertical. Exemplary aperture structures are illustrated in FIG. 16A-16D. FIG. 16A shows an aperture 224 such as illustrated in FIG. 8 which has vertical sidewalls 228 and is cylindrical in geometry. It may be desired that the aperture have non-vertical sidewalls 228, for example, a reentrant profile such as illustrated in FIG. 16B-16D. Such structures are believed to provide a further strengthened joint between the elements of the completed microstructure as they mechanically lock in place the metal to be deposited in the aperture. This minimizes or prevents slippage of the metal filling the aperture Such structures can also be created by using more than one layer, for example, layers 210', 210" as shown in FIG. 16D.

Figure 9:
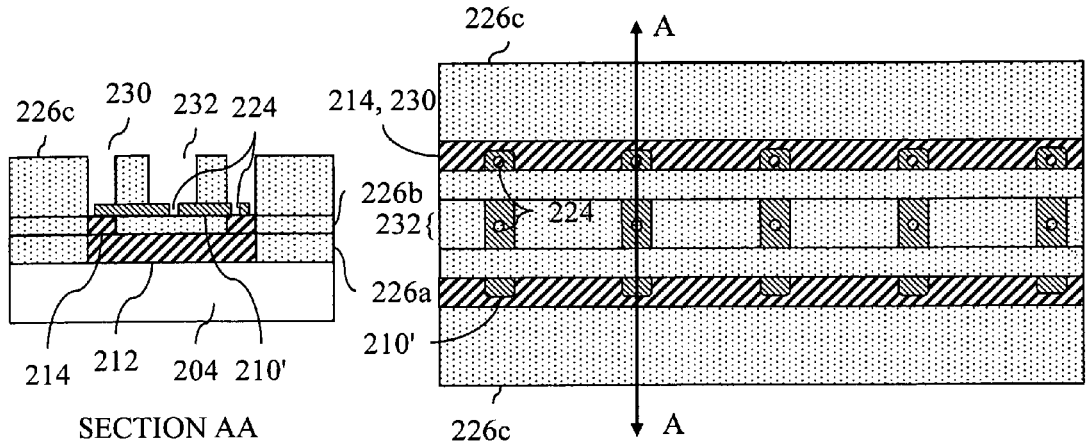

With reference to FIG. 9, a third sacrificial photosensitive layer 226c is coated over the substrate, and is exposed and developed to form patterns 230 and 232 for subsequent filling of apertures 224 and formation of middle sidewall portions of the transmission line outer conductor and the center conductor. The pattern 230 for the middle sidewall portion includes two channels coextensive with the two lower sidewall portions 214. The lower sidewall portions 214 and the end of the dielectric support members 210' overlying the lower sidewall portions are exposed by pattern 230. The pattern 232 for the center conductor is a channel parallel to and between the two middle sidewall patterns, exposing the opposite ends of and supporting portions of the conductor support members 210'. Conventional photolithography techniques and materials, such as those described above, can be used for this purpose.

Figure 10:
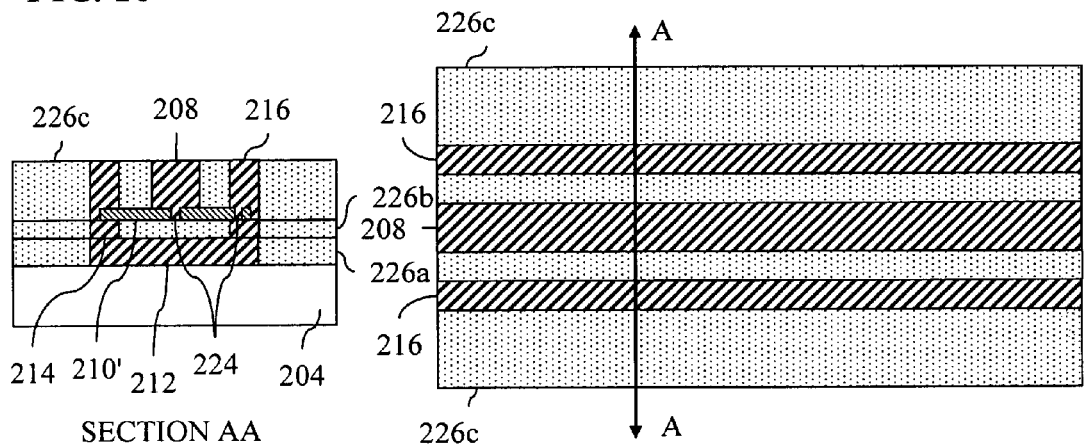

As illustrated in FIG. 10, the apertures 224 are filled and the center conductor 208 and middle sidewall portions 216 of the outer conductor are formed by depositing a suitable metal material into the channels formed in the sacrificial material 226c. The apertures 224 may be filled in the same process and using the same material used in forming the middle sidewall portions and the center conductor. Optionally, the apertures may be filled in a separate process using the same or different materials used for the center conductor and middle sidewall portions. The metal material filling the apertures forms a joint between the dielectric support member 210' and each of the center conductor and outer conductor for affixing the microstructural elements to one another. Appropriate materials and techniques for filling the apertures, and for forming the middle sidewall portions and center conductor are the same as those mentioned above with respect to the base layer 212 and lower sidewall portions 214, although different materials and/or techniques may be employed. Surface planarization may optionally be performed at this stage to remove any unwanted metal deposited on the top surface of the sacrificial material in addition to providing a flat surface for subsequent processing, as has been previously described and optionally applied at any stage.

Figure 17:
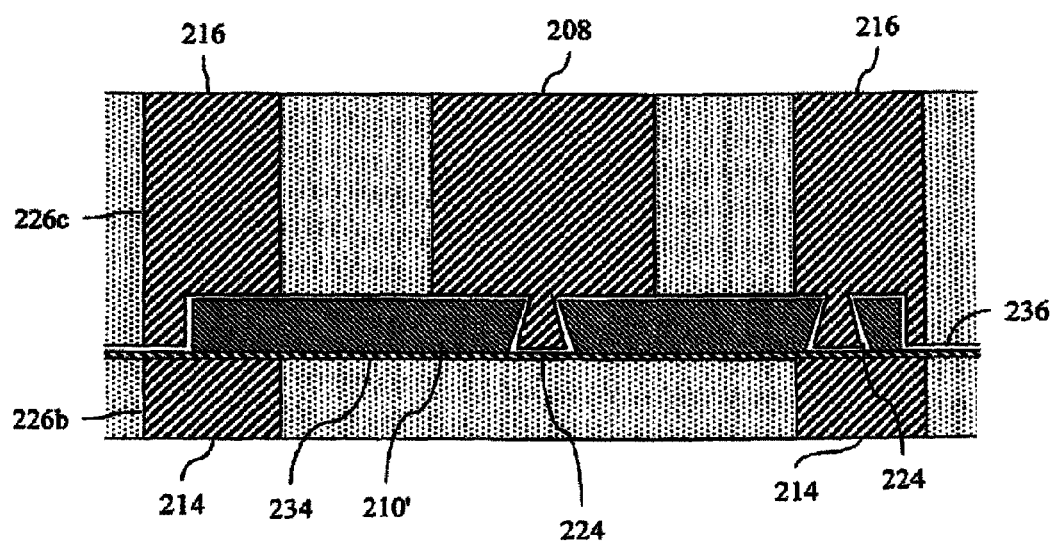
FIG. 17 illustrates a side-sectional view of an exemplary three-dimensional microstructure in accordance with a further aspect of the invention.

In the event a plating process is used to fill the apertures, one or more plating seed layers serving as a base and adhesion layer may be formed over the bottom and/or side surfaces of the apertures. The seed layer may be applied at various points in the process. For example, a seed layer may be applied over the structure of FIG. 6 prior to coating of the dielectric support layer 210 shown in FIG. 7. Following patterning of the apertures, the seed layer would remain on the bottom surface of the apertures. Additionally or alternatively, a plating seed layer may be formed over the structure following patterning of the dielectric support members. An exemplary structure employing a plurality of seed layers with reentrant-shaped apertures is illustrated in FIG. 17. A first seed layer 234 is disposed over the sacrificial material layer 226b and outer conductor lower sidewall portions 214, and below the dielectric support member 210'. A second seed layer 236 is disposed on the side, upper and internal (aperture sidewall) surfaces of the dielectric support member, the aperture bottom surface and other exposed regions of the first seed layer. This provides a structure in which the dielectric support members 210' are sandwiched between the first and second seed layers which are embedded in the outer conductor. In addition to allowing for metal plating of the apertures in the dielectric support member, use of a plurality of seed layers in this manner helps to lock in place the dielectric support members with respect to the other microstructural elements.

The seed layers are ideally conformal and continuous layers on the coated surfaces but are not necessarily so in practice. While a non-continuous seed layer may lead to metal voids in the apertures 224, the presence of such voids will not take away from the overall objective of the metallized apertures so long as a sufficient amount of metal is present in the apertures. The particular seed layer materials selected will depend, for example, on the metal material selected for filling of the apertures. Exemplary seed layer materials include, for example, gold, silver, palladium, nickel, chromium, aluminum and combinations thereof. Of these, stacks of aluminum/nickel and chromium/gold are typical. The seed layer(s) are typically deposited to a thickness of from 1000 to 3000 Å.

Figure 11:
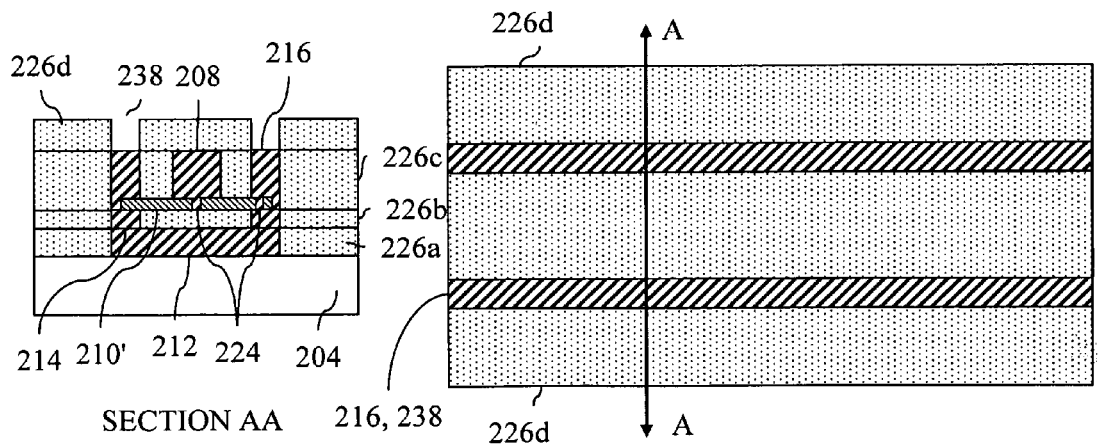

With reference to FIG. 11, a fourth sacrificial material layer 226d is deposited over the substrate, and is exposed and developed to form pattern 238 for subsequent deposition of upper sidewall portions of the outer conductor. The pattern 238 for the upper sidewall portion includes two channels coextensive with and exposing the two middle sidewall portions 216. Conventional photolithography steps and materials as described above can be used for this purpose.

Figure 12:
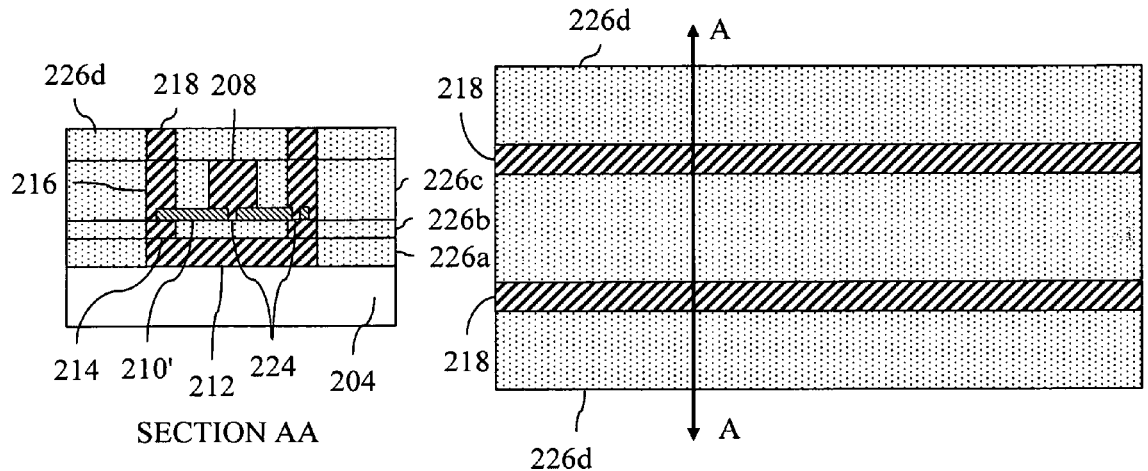

As illustrated in FIG. 12, upper sidewall portions 218 of the outer conductor are next formed by depositing a suitable material into the channels formed in the fourth sacrificial layer 226d. Appropriate materials and techniques for forming the upper sidewalls are the same as those mentioned above with respect to the base layer and other sidewall portions. The upper sidewalls portions 218 are typically formed with the same materials and techniques used in forming the base layer and other sidewalls, although different materials and/or techniques may be employed. Surface planarization can optionally be performed at this stage to remove any unwanted metal deposited on the top surface of the sacrificial material in addition to providing a flat surface for subsequent processing.

Figure 13:
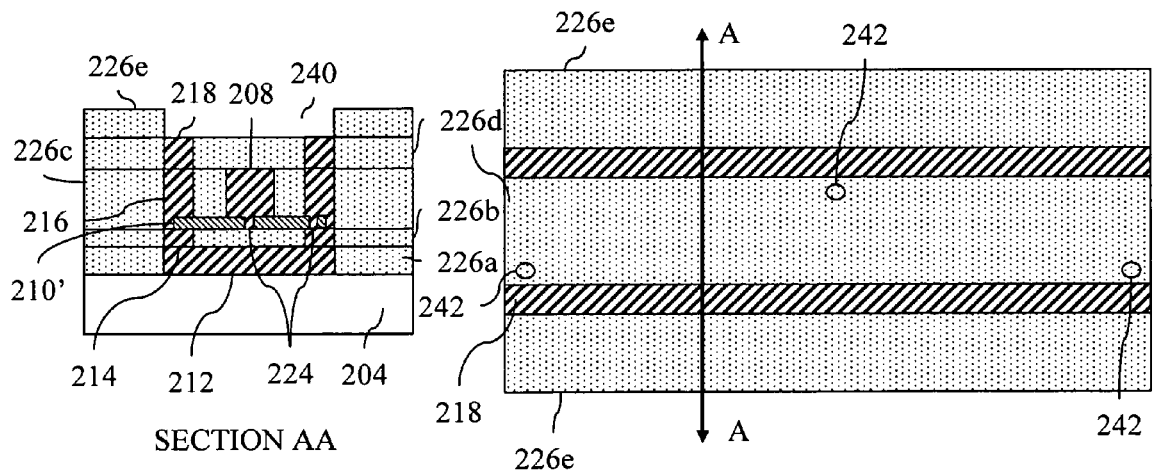

With reference to FIG. 13, a fifth photosensitive sacrificial layer 226e is deposited over the substrate, and is exposed and developed to form pattern 240 for subsequent deposition of the top wall of the transmission line outer conductor. The pattern 240 for the top wall exposes the upper sidewall portions 218 and the fourth sacrificial material layer 226d therebetween. In patterning the sacrificial layer 226e, it may be desirable to leave one or more regions 242 of the sacrificial material in the area between the upper sidewall portions. In these regions, metal deposition is prevented during subsequent formation of the outer conductor top wall. As described below, this will results in openings in the outer conductor top wall facilitating removal of the sacrificial material from the microstructure. These remaining portions of the sacrificial material can, for example, be in the form of cylinders, polyhedrons such as tetrahedrons or other shaped pillars 242.

Figure 14:
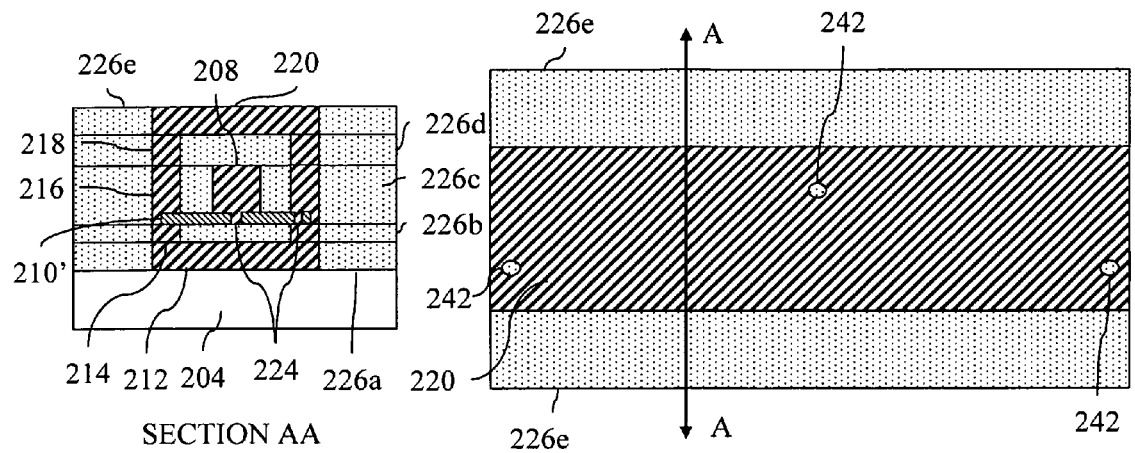

As shown in FIG. 14, the top wall 220 of the outer conductor is next formed by depositing a suitable material into the exposed region over and between the upper sidewall portions 218. Metallization is prevented in the volume occupied by the sacrificial material pillars 242. The top wall 220 is typically formed with the same materials and techniques used in forming the base layer and other sidewalls, although different materials and/or techniques may be employed. Surface planarization can optionally be performed at this stage.

With the basic structure of the transmission line being complete, additional layers may be added or the sacrificial material remaining in the structure may next be removed. The sacrificial material may be removed by known strippers based on the type of material used. In order for the material to be removed from the microstructure, the stripper is brought into contact with the sacrificial material. The sacrificial material may be exposed at the end faces of the transmission line structure. Additional openings in the transmission line such as described above may be provided to facilitate contact between the stripper and sacrificial material throughout the structure. Other structures for allowing contact between the sacrificial material and stripper are envisioned. For example, openings can be formed in the transmission line sidewalls during the patterning process. The dimensions of these openings may be selected to minimize interference with, scattering or leakage of the guided wave. The dimensions can, for example, be selected to be less than ⅛, 1/10 or 1/20 of the wavelength of the highest frequency used. The impact of such openings can readily be calculated and can be optimized using software such as HFSS (High Frequency Structure Simulation) made by Ansoft, Inc.

Figure 15:
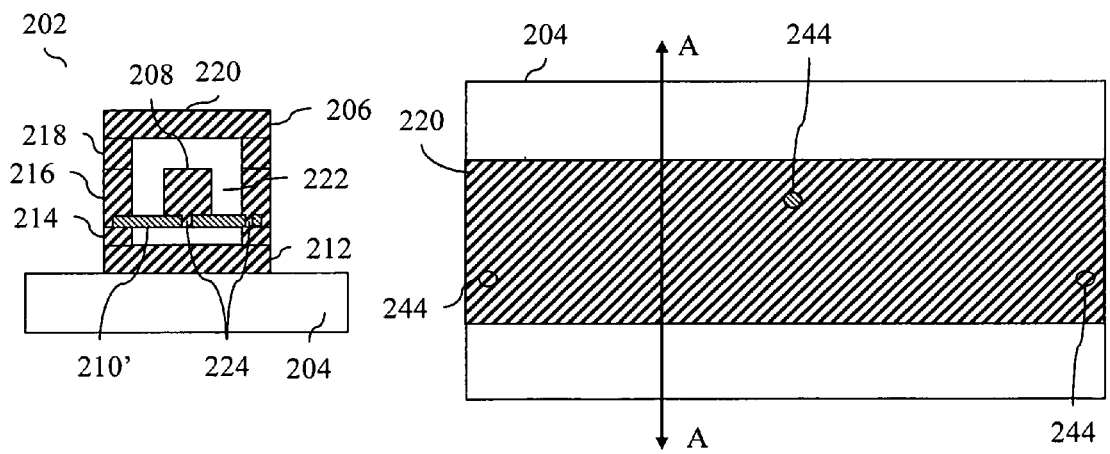

The final transmission line structure 202 after removal of the sacrificial resist is shown in FIG. 15. The space previously occupied by the sacrificial material in and within the outer walls of the transmission line forms apertures 244 in the outer conductor and the transmission line core 222. The core volume is typically occupied by a gas such as air. It is envisioned that a gas having better dielectric properties may be used in the core. Optionally, a vacuum can be created in the core, for example, when the structure forms part of a hermetic package. As a result, a reduction in absorption from water vapor that would otherwise adsorb to the surfaces of the transmission lines can be realized. It is further envisioned that a liquid can occupy the volume 222 between the center conductor and outer conductor.

Figure 18:
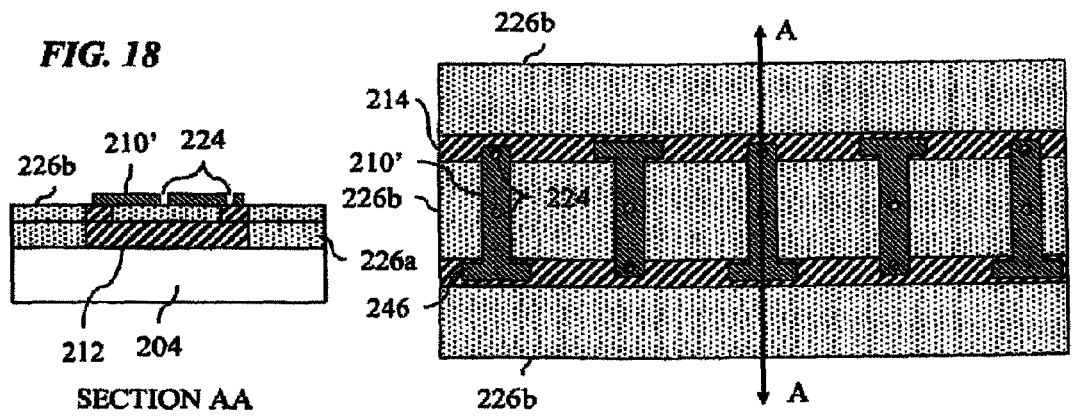
FIG. 18 illustrates side- and top-sectional views of an exemplary three-dimensional microstructure in accordance with a further aspect of the invention.

FIG. 18 illustrates an additional exemplary aspect of the invention which further allows microstructural elements of the microdevice to be maintained in locked engagement with each other. This figure shows the microstructure after patterning of the dielectric support members 210' in the manner described above. The dielectric support members are patterned with a geometry which also reduces the possibility of their pulling away from the outer conductor. In the exemplified microstructure, the dielectric support members are patterned in the form of a "T" shape during the patterning process. During subsequent processing as described above, the top portion 246 of the "T" becomes embedded in the wall of the outer conductor and acts as an anchor-type locking structure. While the illustrated structure includes an anchor-type locking structure at one end of the dielectric support members, it should be clear that multiple such structures may be used, for example, one at each end of the dielectric support members in an "I" shape. The described anchor-type structures may be used additionally or alternatively to one or more of the metallized apertures for locking the dielectric and metal microstructural elements together.

Figure 19:
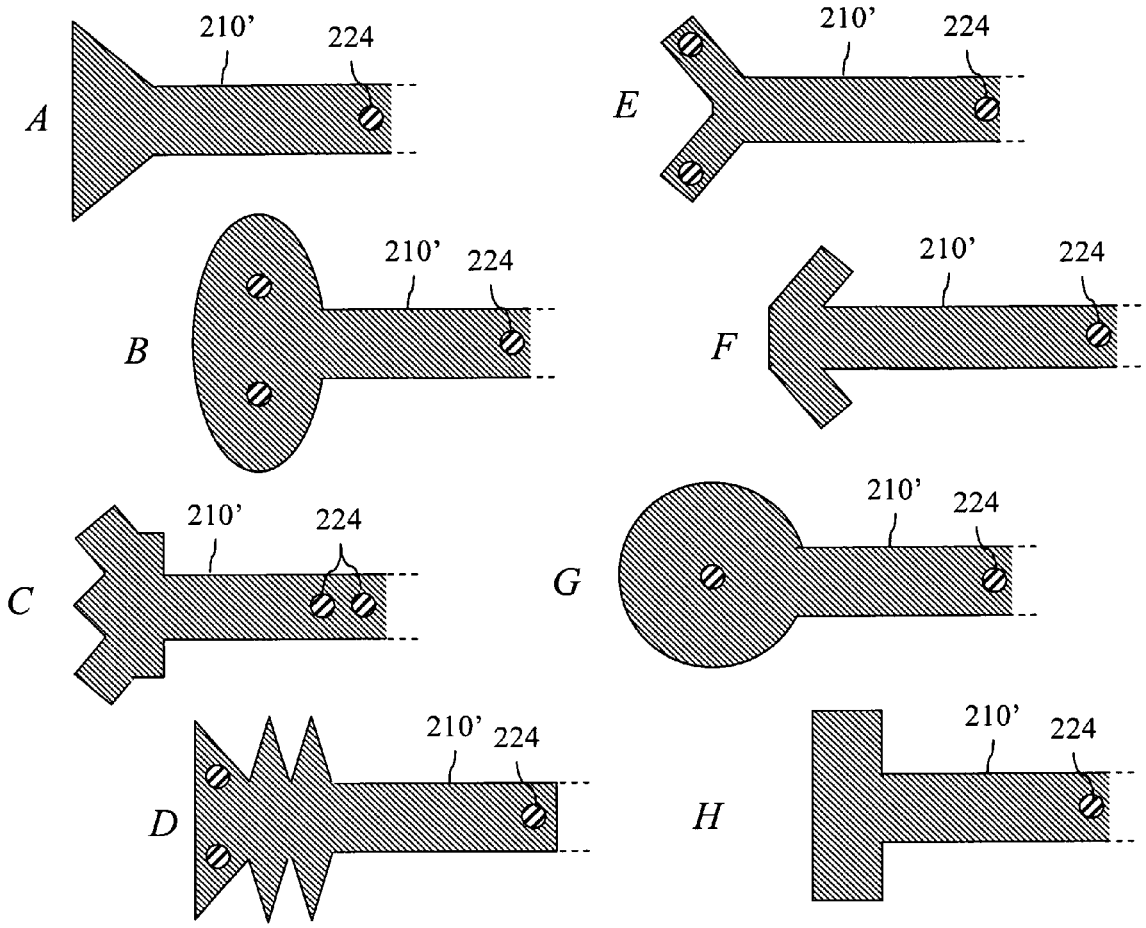
FIG. 19A-19H illustrates partial top-sectional views of exemplary three-dimensional microstructural dielectric elements and apertures in accordance with the invention.

FIGS. 19A-19H illustrate additional exemplary geometries which may be employed for the dielectric support members, including the one or more dielectric support members 210' described with reference to at least FIG. 2 and FIG. 18, in place of the "T" locking structures as illustrated in FIG. 19H. For purposes of illustration, the structures are partial renderings of the support structures. The support structures may optionally include an anchor structure at an opposite end, which may be a mirror image of or a different geometry than the illustrated anchor structure. As a non-limiting example, one end of the dielectric support member may include a "Flat Head" locking structure as illustrated in FIG. 19A, an "Oval" locking structure as illustrated in FIG. 19B, a "Step" locking structure as illustrated in FIG. 19O, or a "Toothed" locking structure as illustrated in FIG. 19D at one end, and include the same locking structure or a geometrically smaller version of the same locking structure at the opposite end. The opposite end of the support structure may alternatively include a "Y" locking structure as illustrated in FIG. 19E, an "Arrow" locking structure as illustrated in FIG. 19F, a "Circular" locking structure as illustrated in FIG. 19G, the "T" locking structure as illustrated in FIG. 19H, or an anchor structure including a different geometry than the illustrated anchor structure. The geometry selected should provide a change in cross-sectional geometry over at least a portion of the support member so as to be resistant to separation from the outer conductor. Reentrant profiles and other geometries providing an increase in cross-sectional geometry in the depthwise direction such as illustrated are typical. In this way, the dielectric support member becomes mechanically locked in place and has a greatly reduced likelihood of pulling away from the outer conductor wall. While the illustrated structures include a single anchor portion on one end thereof, multiple anchors, for example, on each end of the dielectric support, are envisioned. Without wishing to be bound by any particular theory, it is believed that in addition to providing mechanical locking effects, the anchor-locking structures improve adhesion as a result of reduced stress during exposure and development. It is also believed that thermally induced stresses during manufacture can be improved, for example, by removing sharp corners through the use of curvilinear shaping such as in FIGS. 19B and 19G.

For certain applications, it may be beneficial to remove the final transmission line structure from the substrate to which it is attached. This would allow for coupling on both sides of the released interconnect network to another substrate, for example, a gallium arsenide die such as a monolithic microwave integrated circuit or other devices. Release of the structure from the substrate may be accomplished by various techniques, for example, by use of a sacrificial layer between the substrate and the base layer which can be removed upon completion of the structure in a suitable solvent. Suitable materials for the sacrificial layer include, for example, photoresists, selectively etchable metals, high temperature waxes, and various salts.

Figure 20A:
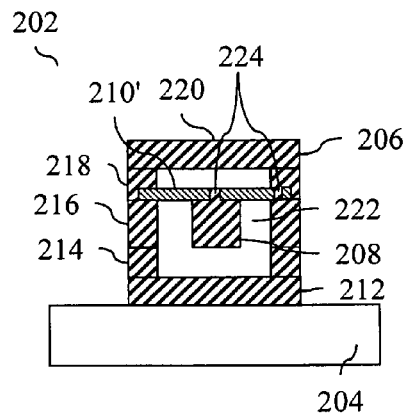
FIG. 20A-20B illustrates cross-sectional views of exemplary three-dimensional structures in accordance with the invention.
Figure 20B:
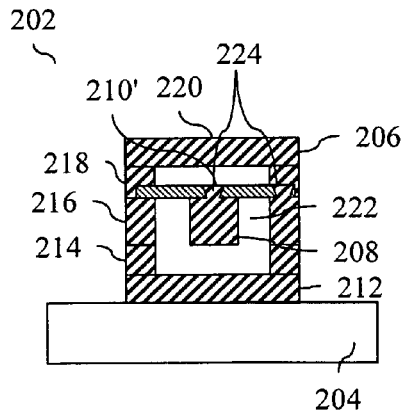

While the exemplified transmission lines include a center conductor formed over the dielectric support members with metallized apertures, it is envisioned that the dielectric support members with metallized apertures can be formed over the center conductor in addition or as an alternative to the underlying dielectric support members as illustrated in FIG. 20A and 20B, which show non-reentrant and reentrant metallized apertures, respectively. In addition, the dielectric support members may be disposed within the center conductor such as in a split center conductor using a variety of geometries, for example, a plus (+)-shape, a T-shape, a box or the geometries shown in FIGS. 16 and 19.

The transmission lines of the invention typically are square in cross-section. Other shapes, however, are envisioned. For example, other rectangular transmission lines can be obtained in the same manner the square transmission lines are formed, except making the width and height of the transmission lines different. Rounded transmission lines, for example, circular or partially rounded transmission lines can be formed by use of gray-scale patterning. Such rounded transmission lines can, for example, be created through conventional lithography for vertical transitions and might be used to more readily interface with external micro-coaxial conductors, to make connector interfaces, etc. A plurality of transmission lines as described above may be formed in a stacked arrangement. The stacked arrangement can be achieved by continuation of the sequential build process through each stack, or by preforming the transmission lines on individual substrates, separating transmission line structures from their respective substrates using a release layer, and stacking the structures. Such stacked structures can be joined by thin layers of solders or conductive adhesives. In theory, there is not a limit on the number of transmission lines that can be stacked using the process steps discussed herein. In practice, however, the number of layers will be limited by the ability to manage the thicknesses and stresses and resist removal associated with each additional layer.

While the three-dimensional microstructures and their methods of formation have been described with reference to the exemplified transmission lines, it should be clear that the microstructures and methods are broadly applicable to a wide array of technical fields which can benefit from the use of micromachining processes for affixing a metal microstructural element to a dielectric microstructural element. The microstructures and methods of the invention find use, for example, in the following industries: telecommunications in microwave and millimeter wave filters and couplers; aerospace and military in radar and collision avoidance systems and communications systems; automotive in pressure and rollover sensors; chemistry in mass spectrometers and filters; biotechnology and biomedical in filters, microfluidic devices, surgical instruments and blood pressure, air flow and hearing aid sensors; and consumer electronics in image stabilizers, altitude sensors, and autofocus sensors.

While the invention has been described in detail with reference to specific embodiments thereof, it will be apparent to one skilled in the art that various changes and modifications can be made, and equivalents employed, without departing from the scope of the claims.

What is claimed is:

1. A three-dimensional microstructure formed by a sequential build process, comprising:
    a first microstructural element comprising a dielectric material and having at least one aperture extending at least partially therethrough;
    a second microstructural element comprising a metal material and having the at least one aperture of the first microstructural element embedded therein;
    a metal material in the aperture affixing the first microstructural element to the second microstructural element; and
    a non-solid volume to which the first microstructural element and/or the second microstructural element are exposed.

2. The three-dimensional microstructure of claim 1, further comprising a substrate over which the first and second microstructural elements are disposed.

3. The three-dimensional microstructure of claim 1, wherein the microstructure comprises a coaxial transmission line comprising a center conductor, an outer conductor and a dielectric support member for supporting the center conductor, wherein the dielectric support member is the first microstructural element, and the inner conductor and/or the outer conductor is the second microstructural element.

4. The three-dimensional microstructure of claim 3, wherein the non-solid volume is under vacuum or in a gas state, and is disposed between the center conductor and the outer conductor.

5. The three-dimensional microstructure of claim 3, wherein the coaxial transmission line has a generally rectangular coaxial geometry.

6. The three-dimensional microstructure of claim 1, wherein the at least one aperture extends completely through the first microstructural element from a first surface to a second surface thereof.

7. The three-dimensional microstructure of claim 1, wherein the at least one aperture has a reentrant shape.

8. The three-dimensional microstructure of claim 1, wherein the metal material of the second microstructural element and the metal material in the at least one aperture are of the same material.

9. A method of forming a three-dimensional microstructure by a sequential build process, comprising:
    disposing a plurality of layers over a substrate, wherein the layers comprise a layer of a dielectric material, a layer of a metal material and a layer of a sacrificial material;
    forming a first microstructural element comprising the dielectric material and having at least one aperture extending at least partially therethrough;
    forming a second microstructural element comprising the metal material;
    depositing a metal material in the at least one aperture, affixing the first microstructural element to the second microstructural element; and
    removing the sacrificial material to form a non-solid volume to which the first microstructural element and/or the second microstructural element are exposed.

10. The method of claim 9, wherein the microstructure comprises a coaxial transmission line comprising a center conductor, an outer conductor and a dielectric support member for supporting the center conductor, wherein the dielectric support member is the first microstructural element, and the inner conductor and/or the outer conductor is the second microstructural element.

11. A three-dimensional microstructure formed by a sequential build process, comprising:
- a first microstructural element comprising a dielectric material and having at least one aperture extending at least partially therethrough;
- a second microstructural element comprising a metal material;
- a metal material in the at least one aperture affixing the first microstructural element to the second microstructural element;
- a substrate over which the first and second microstructural elements are disposed; and
- a non-solid volume to which the first microstructural element and/or the second microstructural element are exposed.

12. The three-dimensional microstructure of claim 11, wherein the microstructure comprises a coaxial transmission line comprising a center conductor, an outer conductor and a dielectric support member for supporting the center conductor, wherein the dielectric support member is the first microstructural element, and the inner conductor and/or the outer conductor is the second microstructural element.

13. The three-dimensional microstructure of claim 12, wherein the non-solid volume is under vacuum or in a gas state, and is disposed between the center conductor and the outer conductor.

14. The three-dimensional microstructure of claim 12, wherein the coaxial transmission line has a generally rectangular coaxial geometry.

15. The three-dimensional microstructure of claim 11, wherein the at least one aperture extends completely through the first microstructural element from a first surface to a second surface thereof.

16. The three-dimensional microstructure of claim 11, wherein the at least one aperture has a reentrant shape.

17. The three-dimensional microstructure of claim 11, wherein the metal material of the second microstructural element and the metal material in the at least one aperture are of the same material.

* * * * *